United States Patent
Paetz

Patent Number: 5,213,626
Date of Patent: May 25, 1993

[54] TRANSPARENT PANE FOR VEHICLES

[75] Inventor: Werner Paetz, Diessen, Fed. Rep. of Germany

[73] Assignee: Webasto-Schade GmbH, Oberpfaffenhofen, Fed. Rep. of Germany

[21] Appl. No.: 838,885

[22] Filed: Feb. 21, 1992

[30] Foreign Application Priority Data

Feb. 21, 1991 [DE] Fed. Rep. of Germany ....... 4105389

[51] Int. Cl.$^5$ .................. H01L 31/042; H01L 31/048
[52] U.S. Cl. .................... 136/244; 136/251; 136/291; 136/293
[58] Field of Search .............. 136/244, 251, 291, 293

[56] References Cited

U.S. PATENT DOCUMENTS

| | | | |
|---|---|---|---|
| 4,686,321 | 8/1987 | Kishi | 136/244 |
| 4,717,790 | 1/1988 | Gochermann | 136/251 |
| 5,011,544 | 4/1991 | Gaddy et al. | 136/246 |
| 5,059,254 | 10/1991 | Yaba et al. | 136/251 |

FOREIGN PATENT DOCUMENTS

| | | | |
|---|---|---|---|
| 3817946 | 11/1989 | Fed. Rep. of Germany | 136/251 |
| 58-23488 | 5/1983 | Japan | 136/244 |
| 58-210680 | 3/1984 | Japan | 136/244 |
| 60-260164 | 12/1985 | Japan | 136/251 |
| 62-102570 | 10/1987 | Japan | 136/244 |

Primary Examiner—Aaron Weisstuch
Attorney, Agent, or Firm—Sixbey, Friedman, Leedom & Ferguson

[57] ABSTRACT

Transparent pane for vehicles, in particular, a transparent cover for sliding roofs, lifting roofs and the like, with a transparent outer layer and a solar laminate lying flat against the inside of this outer layer. The active part of the solar laminate is formed of a first subsection lying in the outer edge area of the pane which is made of crystalline semiconductor material, and a second subsection that is made of an amorphous semiconductor material.

18 Claims, 2 Drawing Sheets

1

TRANSPARENT PANE FOR VEHICLES

BACKGROUND OF THE INVENTION

The invention relates to a transparent pane for vehicles, in particular, a transparent cover for vehicle sunroofs, including sliding roofs, lifting roofs, and the like, which has a transparent outer layer and a solar laminate lying flat against the inside of this outer layer.

In known transparent panes of this type (German Offenlegungsschrift No. 38 17 946 A1 and published Japanese Application 62-102570 A), the solar laminate comprises a transparent semiconductor layer that consists, for example, of amorphous silicon. It is true that a solar laminate with amorphous semiconductor material allows an essentially unimpeded view through the pane, for example, a glass cover of a vehicle roof, but the electrical power supplied by it is relatively limited. Solar cells with a crystalline semiconductor layer are more powerful. But, such crystalline semiconductor layers are opaque.

SUMMARY OF THE INVENTION

The invention is based on the object of providing, for use in vehicles, a transparent pane of the above-mentioned type which, while retaining the area of transparency that is typical for such panes, is able to supply a higher output of electrical energy obtained by conversion of incident light.

This object is achieved according to the invention, starting with a transparent pane of the above-mentioned type, by having the active part of the solar laminate, in a subsection lying in the outer edge area of the pane, formed of crystalline semiconductor material and, in another subsection of the pane, of amorphous semiconductor material.

In the transparent pane according to the invention, thus, crystalline, relatively powerful, semiconductor material and amorphous, relatively low-power, semiconductor material are used in a way known in the art from Japanese Application No. 58-210680 A for a solar battery. Here, the circumstance is exploited that, in panes used in vehicles, the outer edge area cannot be looked through anyway, because this subsection is needed to support and hold the pane. These pane areas, that are not used for looking out, can be used according to the invention to generate energy with relatively high efficiency by solar cells with crystalline semiconductor material, for example, monocrystalline or polycrystalline silicon. For example, in covers of vehicle roofs, an area of transparency can be maintained as is common in passive covers (i.e., those that do not supply electrical energy). But also, the areas of the pane remaining transparent are not lost for the generation of solar energy. Rather, they are also used, even if with limited efficiency, for generating energy, by entirely or at least partially covering them with solar cells equipped with an amorphous semiconductor material, for example, amorphous silicon which, as a thin layer, is transparent or was made transparent by making fine holes in it.

To maximize the electrical power supplied, preferably, essentially the whole area of the transparent outer layer of the pane that is free of crystalline semiconductor material can be backed with solar cells whose active part consists of amorphous semiconductor material.

In a further embodiment of the invention, the solar cells with crystalline semiconductor material and the solar cells with amorphous semiconductor material are interconnected in groups, so that the voltage supplied by both groups is equal, in each case. This makes it possible, e.g., to connect the electric circuits of both solar cell groups without problems. To avoid undesired, mutual interactions in such a case, advantageously the electric circuits of both solar cell groups can be coupled to one another by reverse current blocks, for example, in the form of reverse current blocking diodes or the like. As a crystalline semiconductor material, monocrystalline or polycrystalline silicon is particularly suitable, while amorphous silicon is especially suitable as an amorphous semiconductor material. But, other semiconductor materials can also be employed, for example, combinations of cadmium sulfide and cadmium telluride or with gallium arsenide can be used.

These and further objects, features, and advantages of the present invention will become apparent from the following description when taken in connection with the accompanying drawings which, for purposes of illustration only, show several embodiments in accordance with the present invention.

BRIEF DESCRIPTION OF THE DRAWINGS

FIG. 1 is a top view of a transparent cover for a motor vehicle sliding roof, lifting roof, or the like;

FIG. 2 is an enlarged partial cross-sectional view of a glass cover for a vehicle sliding roof, lifting roof, or the like;

DETAILED DESCRIPTION OF THE PREFERRED EMBODIMENTS

Figure 1:
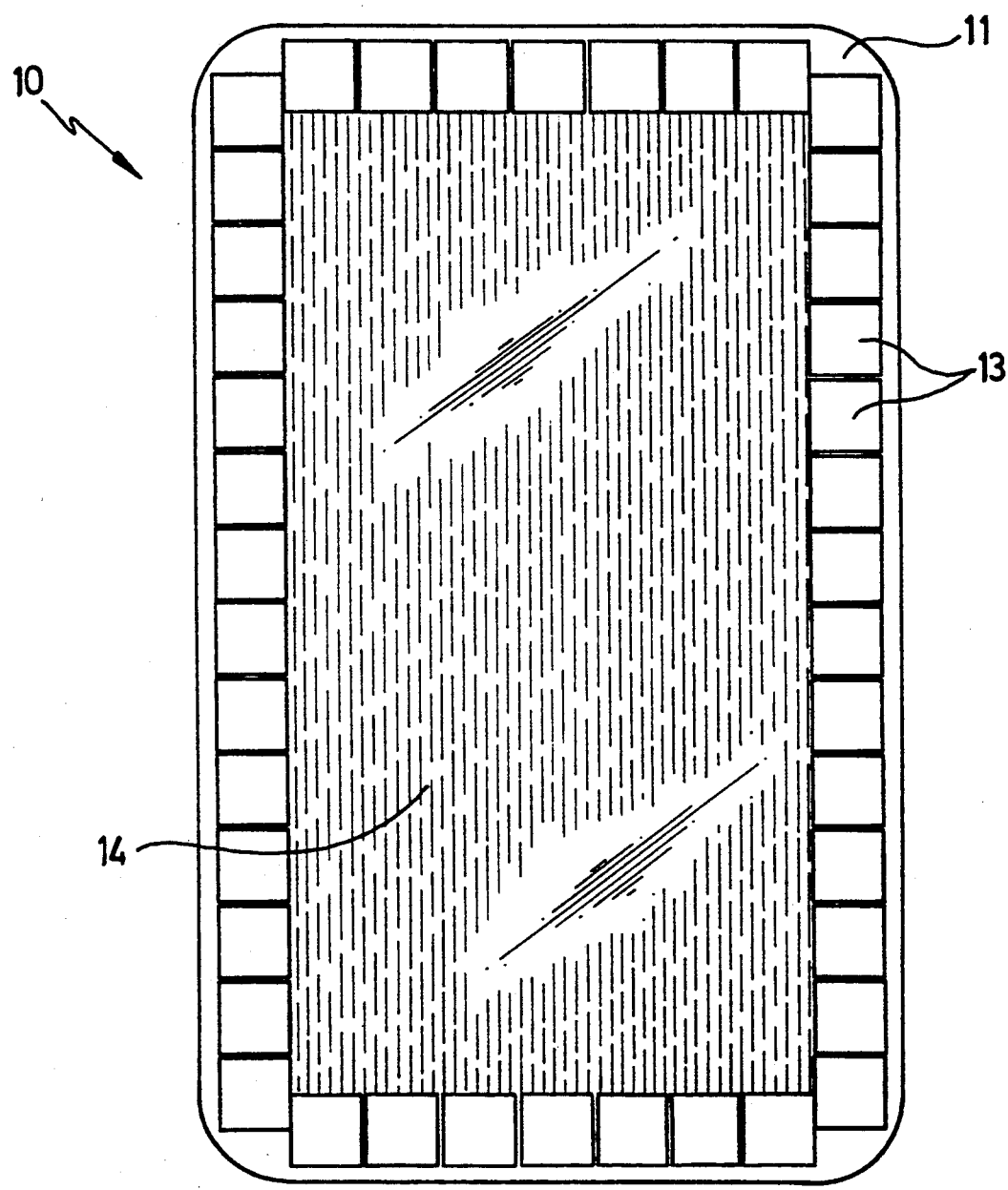
Figure 2:
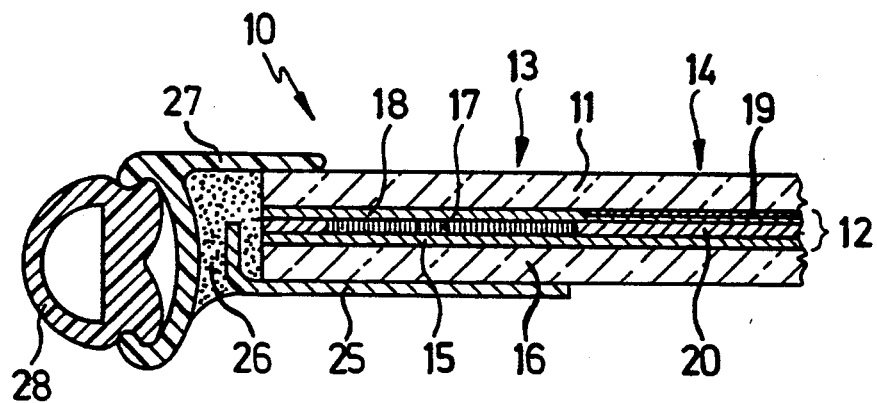

The transparent cover 10 for a vehicle sunroof, such as a sliding roof, lifting roof or the like, illustrated in FIGS. 1 and 2, comprises a transparent outer layer 11 that can be made, for example, of glass, acrylic resin, polycarbonate resin, or the like. A solar laminate designated overall by 12 lies flat against the inside of outer layer 11. The active part of solar laminate 12 consists, in a subsection 13 forming the outer edge area of cover 10, of crystalline and thus of opaque semiconductor material, for example, monocrystalline or polycrystalline silicon. In another subsection 14 of cover 10, the solar laminate 12 is formed of amorphous semiconductor material, for example, amorphous silicon, that is made transparent, as a whole, as a result of it being of a sufficiently thin layer or by making fine holes in it. In the embodiment indicated in FIG. 1, essentially the whole area of transparent outer layer 11 that is free of crystalline semiconductor material is backed by solar cells whose active part consists of amorphous semiconductor material. That is, subsection 14 occupies the whole space surrounded by subsection 13. The opaque outer edge area forms a covering that prevents the carrier and guide elements of the cover from being seen from the outside.

In the embodiment illustrated in FIG. 2, solar laminate 12 is provided with a transparent lower adhesive film 15, against the underside of which a transparent inner layer 16 lies. Transparent inner layer 16 can be made of the same material as outer layer 11. Outer layer 11 and inner layer 16 can be, in particular, clear glass plates, each about 2 mm thick, for example.

A crystalline solar cell 17 is illustrated in subsection 13. Crystalline solar cell 17 lies between lower adhesive film 15 and a likewise transparent upper adhesive film 18 which, for its part, has outer layer 11 glued to its top surface. Amorphous solar cells 19 are attached, e.g., vapor-deposited, as a thin layer on the underside of outer layer 11 in subsection 14. The underside of solar cells 19 is covered by upper adhesive film 18. A transparent compensating film 20, whose thickness corresponds at least approximately to the thickness of crystalline solar cells 17, is placed inside subsection 14 between the adhesive films 15 and 18. The solar laminate 12, including components 15 and 17 to 20, can have a thickness of about, e.g., 1 mm.

Cover 10 is supported in its edge area by a cover inner plate 25, of which only an outer edge area is shown in FIG. 2. The cover inner plate 25 is connected to layers 11, 16, to solar laminate 12 and to an edge profile 27 by an embedding compound 26, for example, in the form of a suitable adhesive. The edge profile 27 engages around the outer edge of outer layer 11 and has a hollow chamber seal 28 attached to it. Edge profile 27, together with the inner plate 25 connected thereto, form an edge molding.

Figure 3:
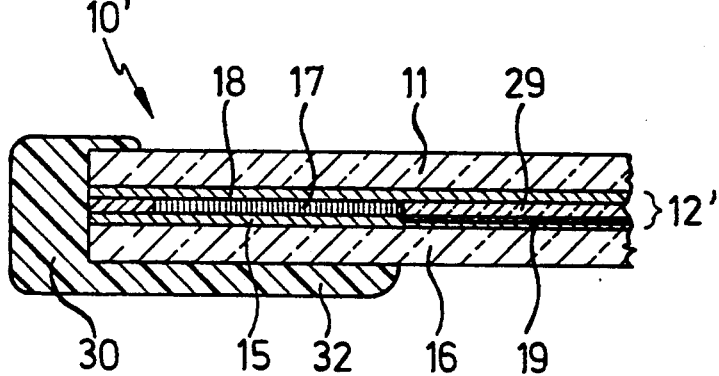
FIG. 3 is a sectional view similar to that FIG. 2 of a modified embodiment of the cover.

FIG. 3 shown a partial cross section of a transparent cover 10' of a vehicle roof according to a modified embodiment. This embodiment differs from the embodiment of FIG. 2 in that a solar laminate 12' is provided that comprises, instead of compensating film 20, a transparent carrier layer 29. On one side of carrier layer 29, for example, the underside, amorphous solar cells 19 are attached, in particular by vapor-deposition. Otherwise, the design of the layers corresponds to that of the cover shown in FIG. 2. The outer edge of layers 11, 16 and of solar laminate 12' is surrounded by an edge molding in the form of a border 30 that can have, for example, an edge seal placed on it similar to that shown in FIG. 2, or a coating, for example, a polyurethane foam, may be applied.

The direction of the incidence of radiant energy is from above relative to the illustration in FIGS. 2 and 3. Subsection 13 with crystalline semiconductor material can extend, for example, according to FIG. 3, so far inward that it corresponds to the dimension of longer, inner leg 32 of border 30.

Figure 4:
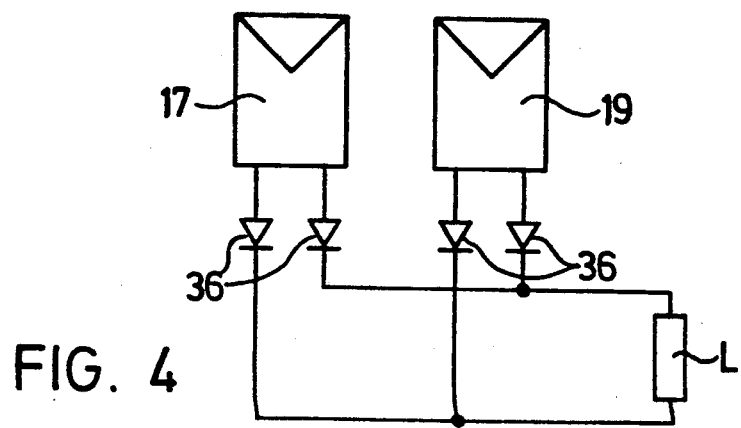
FIG. 4 is a block diagram for the mutual connection of both solar cell groups provided according to the invention.

According to FIG. 4, solar cells 17 with crystalline semiconductor material and solar cells 19, whose active part consists of amorphous semiconductor material, are interconnected separately in groups, in each case so that the voltage supplied from both solar cell groups is at least approximately equal. The electric circuits of both groups of solar cells 17 or 19 are connected in parallel. Here, reverse current blocking elements, such as reverse current blocking diodes 36, are connected to the solar cell groups to avoid undesired reverse currents. The reference character L indicates a load that can involve, for example, a fan. It is also possible to recharge the motor vehicle battery from solar cells 17 and 19.

The above-explained arrangements are suited not only for covers of vehicle roofs but, in particular, also for side and rear windows of vehicles.

While we have shown and described various embodiments in accordance with the present invention, it is understood that the same is not limited thereto, but is susceptible of numerous changes and modifications as known to those skilled in the art, and we, therefore, do not wish to be limited to the details shown and described herein, but intend to cover all such changes and modifications as are encompassed by the scope of the appended claims.

I claim:

1. Transparent pane for vehicles, with a transparent outer layer, and a solar laminate lying flat against the inside of this outer layer, wherein an active part of the solar laminate comprises a first subsection located in an outer edge area of the pane, said first subsection being formed of a crystalline semiconductor material, and a second subsection, said second subsection being formed of an amorphous semiconductor material.

2. Transparent pane according to claim 1, wherein essentially the whole area of the transparent outer layer that is free of crystalline semiconductor material has solar cells whose active part is formed of amorphous semiconductor material placed beneath it.

3. Transparent pane according to claim 2, wherein solar cells with crystalline semiconductor material and solar cells with amorphous semiconductor material are each interconnected into separate groups in a manner that the voltage supplied by the groups is at least approximately equal.

4. Transparent pane according to claim 3, wherein the electric circuits of the solar cell groups are connected in parallel.

5. Transparent pane according to claim 4, wherein the electric circuits of the solar cell groups are coupled to one another by reverse current blocking elements.

6. Transparent pane according to claim 5, wherein the crystalline semiconductor material is formed of one of monocrystalline or polycrystalline silicon.

7. Transparent pane according to claim 6, wherein the amorphous semiconductor material is amorphous silicon.

8. Transparent pane according to claim 1, wherein solar cells with crystalline semiconductor material and solar cells with amorphous semiconductor material are each interconnected into separate groups in a manner that the voltage supplied by the groups is at least approximately equal.

9. Transparent pane according to claim 8, wherein the electric circuits of the solar cell groups are connected in parallel.

10. Transparent pane according to claim 9, wherein the electric circuits of the solar cell groups are coupled to one another by reverse current blocking elements.

11. Transparent pane according to claim 10, wherein the crystalline semiconductor material is formed of one of monocrystalline or polycrystalline silicon.

12. Transparent pane according to claim 11, wherein the amorphous semiconductor material is amorphous silicon.

13. Transparent pane according to claim 1, wherein the crystalline semiconductor material is formed of one of monocrystalline or polycrystalline silicon.

14. Transparent pane according to claim 13, wherein the amorphous semiconductor material is amorphous silicon.

15. Transparent pane according to claim 1, wherein the amorphous semiconductor material is amorphous silicon.

16. Transparent pane according to claim 1, wherein the pane is a cover panel of a vehicle roof.

17. Transparent pane according to claim 16, wherein cover panel is provided with a perimetric edge molding on the periphery thereof.

18. Transparent pane according to claim 17, wherein the perimetric edge molding has an inner leg which runs on an underside of the transparent pane, said first subsection formed of crystalline semiconductor material extending inwardly from the periphery of the cover panel to substantially the same extent as said inner leg.

* * * * *